United States Patent
Ko

(10) Patent No.: US 8,017,454 B2
(45) Date of Patent: Sep. 13, 2011

(54) FUSE OF SEMICONDUCTOR DEVICE AND METHOD FOR FORMING THE SAME

(75) Inventor: Min Gu Ko, Bucheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 240 days.

(21) Appl. No.: 12/272,132

(22) Filed: Nov. 17, 2008

(65) Prior Publication Data

US 2009/0236687 A1 Sep. 24, 2009

(30) Foreign Application Priority Data

Mar. 19, 2008 (KR) ........................ 10-2008-0025448

(51) Int. Cl.
*H01L 21/82* (2006.01)
(52) U.S. Cl. ......... 438/132; 438/514; 257/209; 257/529
(58) Field of Classification Search .................. 438/132, 438/514; 257/209, 529
See application file for complete search history.

(56) References Cited

U.S. PATENT DOCUMENTS

| 6,794,226 B2 * | 9/2004 | Cabral et al. .................. 438/132 |
| 7,227,238 B2 | 6/2007 | Ito et al. |
| 2005/0277232 A1 * | 12/2005 | Wu et al. ....................... 438/132 |

FOREIGN PATENT DOCUMENTS

| JP | 56-138947 | 10/1981 |
| JP | 59-055061 A | 3/1984 |
| KR | 10-1999-0052404 | 7/1999 |

* cited by examiner

*Primary Examiner* — Zandra Smith
*Assistant Examiner* — Christy Novacek
(74) *Attorney, Agent, or Firm* — Marshall, Gerstein & Borun LLP

(57) ABSTRACT

A method for forming a fuse of a semiconductor device includes performing an ion-implanting process at sides of a fuse blowing region of a metal fuse, thereby increasing the concentration of impurity ions of a thermal transmission path region. In a subsequent laser blowing process, as a result of the increased resistance of metal fuse the electric and thermal conductivity is reduced, thereby increasing the thermal condensation efficiency of the fuse blowing region and improving the efficiency of the laser blowing process.

10 Claims, 5 Drawing Sheets

(i)

(ii)

(i)

(ii)

FUSE OF SEMICONDUCTOR DEVICE AND METHOD FOR FORMING THE SAME

CROSS-REFERENCES TO RELATED APPLICATIONS

Priority to Korean patent application number 10-2008-0025448, filed on Mar. 19, 2008, which is incorporated by reference in its entirety, is claimed.

BACKGROUND OF THE INVENTION

The present invention relates to a fuse of a semiconductor device, and a method for forming the same.

If at least one memory cell of a memory array of a semiconductor device has a defect due to fabrication of the semiconductor device, the whole device is regarded as being defective and discarded, thereby degrading the device yield. To overcome this problem, the semiconductor device is designed with redundancy cells so that a defective cell may be replaced with a redundancy cell resulting in repair of the whole memory, thereby improving yield.

The repair operation with a redundancy cell is performed to identify a defective memory cell through a test after wafer processing and to replace the corresponding address with an address signal of a spare, redundancy cell. When an address signal corresponding to a defective line is inputted, the defective line is substituted by a redundancy line.

In order to perform the above repair process for repairing the defective circuit, after a semiconductor device is fabricated, an oxide film over a metal fuse is removed to open a fuse box, a laser is irradiated into the corresponding metal fuse to cut a metal fuse. A wire disconnected by irradiation of the laser is referred to as a metal fuse, and the disconnected site and its surrounding region are referred to as a fuse box.

FIG. 1 is a diagram illustrating a conventional fuse of a semiconductor device, and a conventional method for forming the same. A first interlayer insulating film 100 is formed over a semiconductor substrate (not shown) having a lower structure. A plurality of metal fuses 110 are formed over the first interlayer insulating film 100. The metal fuse is formed to have a line type.

A second interlayer insulating film (not shown) is formed over the first interlayer insulating film 100 and the metal fuse 110. A part of the second interlayer insulating film (not shown) is etched to form a fuse open region. A part of the second interlayer insulating film (not shown) remains on the metal fuse 110.

One of the metal fuses 110 is selected, and a laser blowing process is performed on the selected metal fuse 110. A region disconnected by the laser blowing process is defined as a fuse blowing region 110a.

When an energy is applied to the fuse blowing region 110a in the laser blowing process, a crack is generated in the second interlayer insulating film (not shown) that remains on the fuse blowing region 110a by a heat generated from the laser. The second interlayer insulating film (not shown) that remains on the metal fuse is removed to cut the metal fuse, which is vaporized in the air.

In the above-described fuse of the semiconductor device and method for forming the same, heat generated in the laser blowing process conducts away from the fuse out into the metal line, so that it is difficult to concentrate enough heat to cut the metal fuse. As a result, the metal material of the fuse is not completely vaporized, and un-vaporized metal materials remains resulting in the fuse not being cut.

BRIEF SUMMARY OF THE INVENTION

Various embodiments of the present invention are directed at providing a fuse of a semiconductor device and a method for forming the same.

According to an embodiment of the present invention, a method for forming a fuse of a semiconductor device may include: forming an interlayer insulating film over a semiconductor substrate; forming a metal fuse including a fuse blowing region over the interlayer insulating film; forming a mask pattern to open both sides of the fuse blowing region over the metal fuse and the interlayer insulating film; performing an ion-implanting process with the mask pattern as a barrier to form an ion-implanting region in the metal fuse; and removing the mask pattern.

The metal fuse may be formed to have a line type or a cross type.

The cross type metal fuse may have a smaller critical dimension (CD) of both sides of the fuse blowing region than that of the fuse blowing region.

The mask pattern may be formed over the fuse blowing region and an edge of the metal fuse.

The ion-implanting process may be performed with one selected from the group consisting of oxygen, nitrogen and boron ions.

The dose of the oxygen ions may range from about $1.4 \times 10E13$ to about $1.4 \times 10E18$ ions/cm$^2$.

The dose of the nitrogen ions may range from about $1.4 \times 10E13$ to about $1.4 \times 10E18$ ions/cm$^2$.

The dose of the boron ions may range from about $1.0 \times 10E10$ to about $2.0 \times 10E13$ ions/cm$^2$.

The ion-implanting process may be performed with an energy ranging from about 200 to about 400 keV.

After removing the mask pattern, the method may further include: forming an insulating film over the metal fuse and the interlayer insulating film; etching the insulating film to form a fuse open region; and irradiating a laser into the fuse blowing region to cut the metal fuse.

According to an embodiment of the present invention, a fuse of a semiconductor device may include: a metal fuse including a fuse blowing region; and an ion-implanting region formed at both sides of the fuse blowing region.

The metal fuse may be formed to have a line type or a cross type.

The ion-implanting region may include one or more selected from the group consisting of oxygen, nitrogen and boron ions.

The ion-implanting region may be formed between the fuse blowing region and an edge of the metal fuse.

DESCRIPTION OF SPECIFIC EMBODIMENTS

Figure 1:
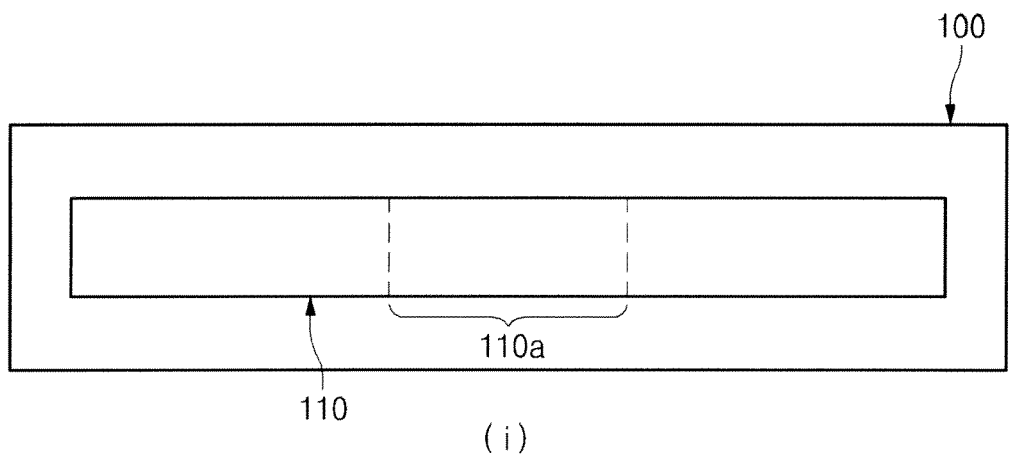
FIG. 1 is a plane diagram illustrating a conventional fuse of a semiconductor device and a conventional method for forming the same.
Figure 1:
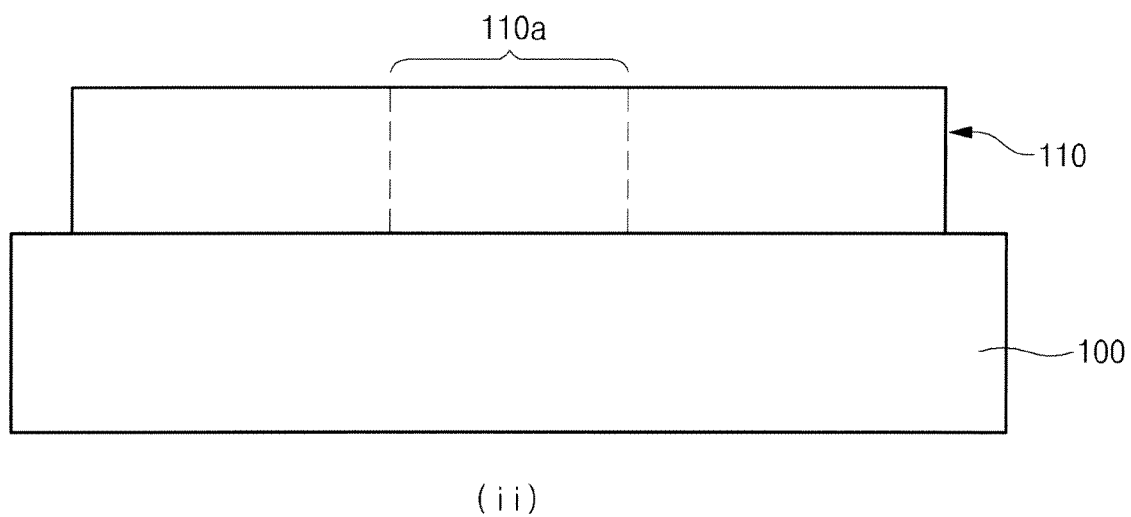
Figure 2A:
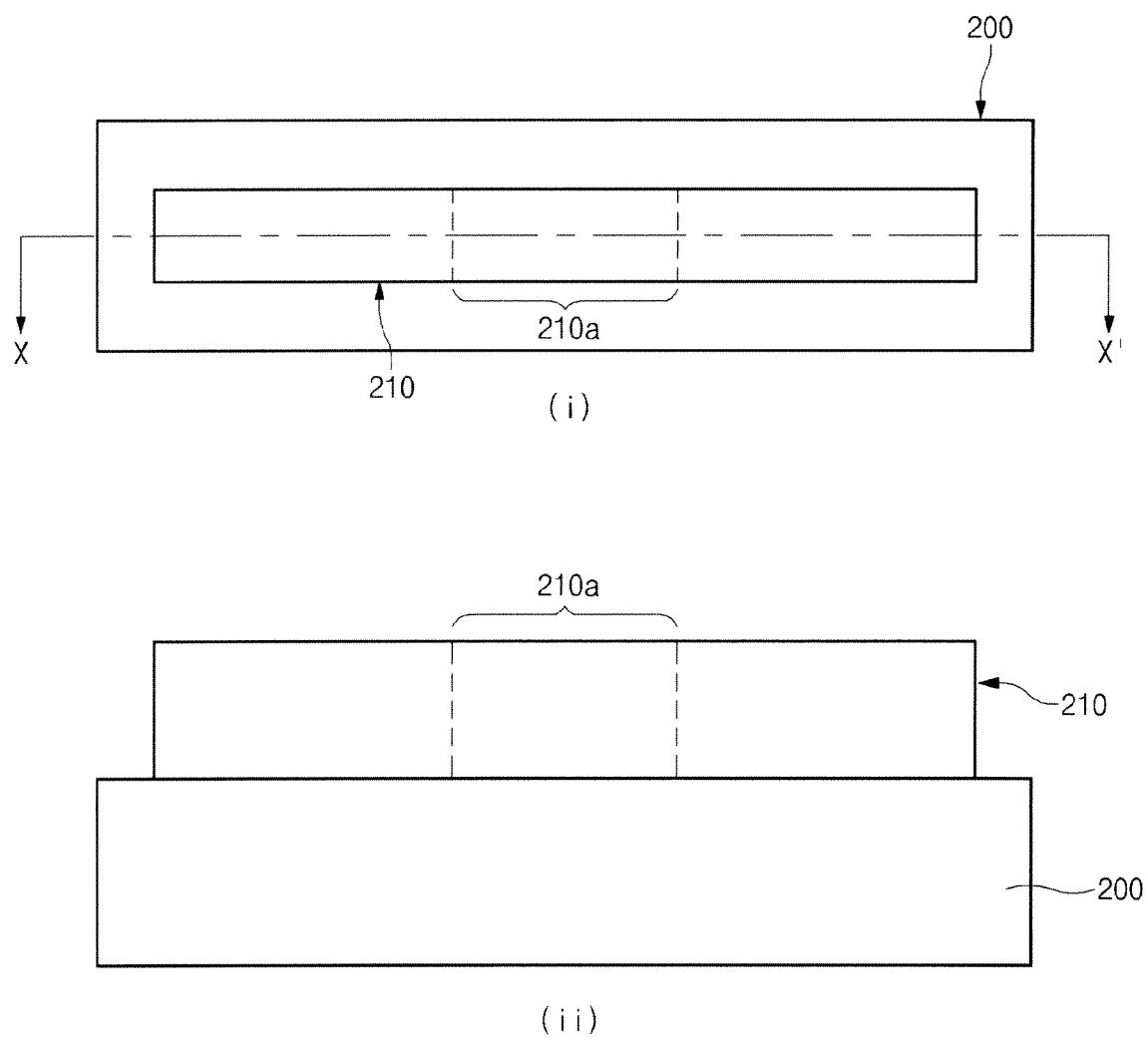
FIGS. 2a to 2c are diagrams illustrating a fuse of a semiconductor device and a method for forming the same according to an embodiment of the present invention.
Figure 2B:
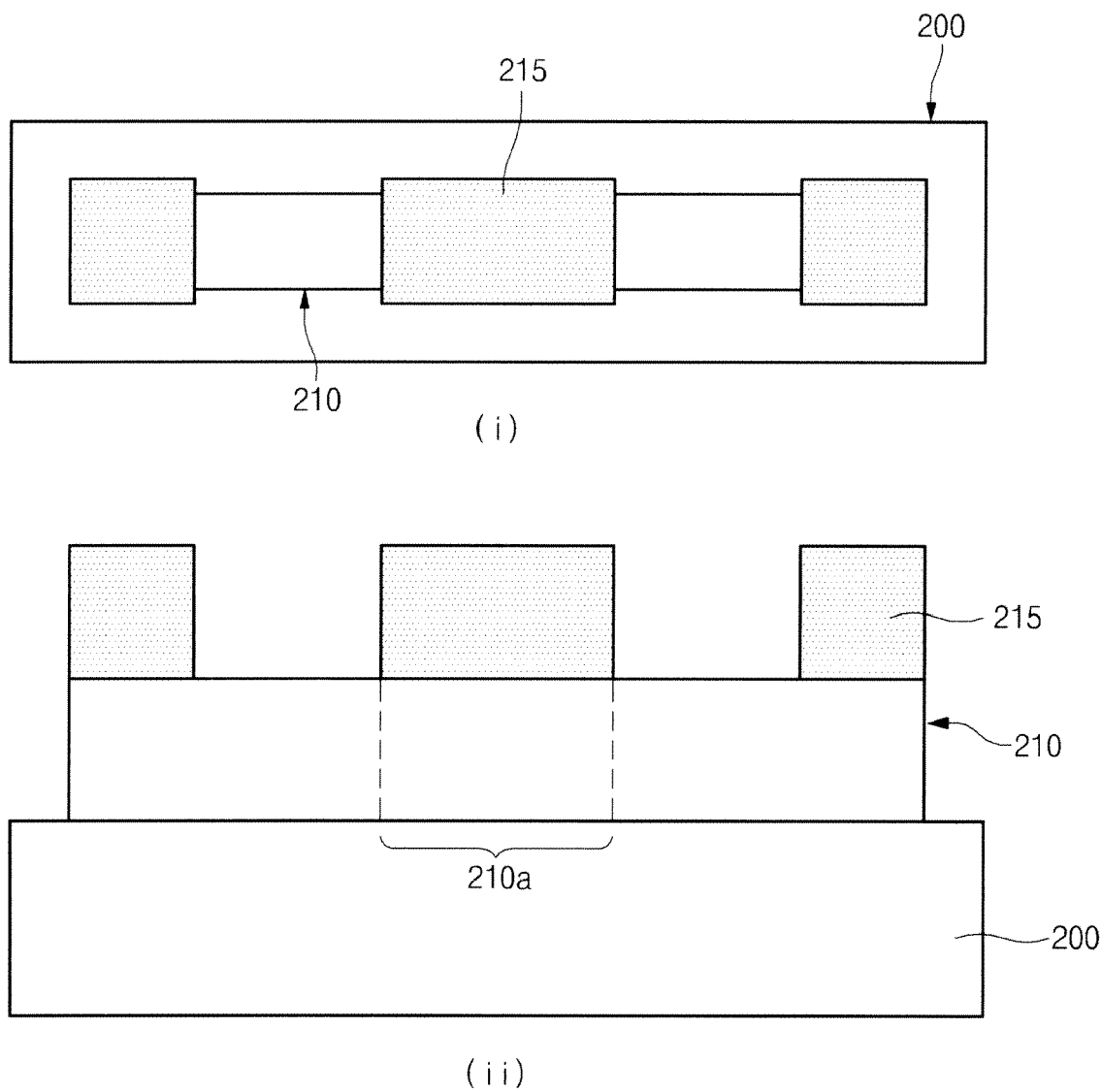
Figure 2C:
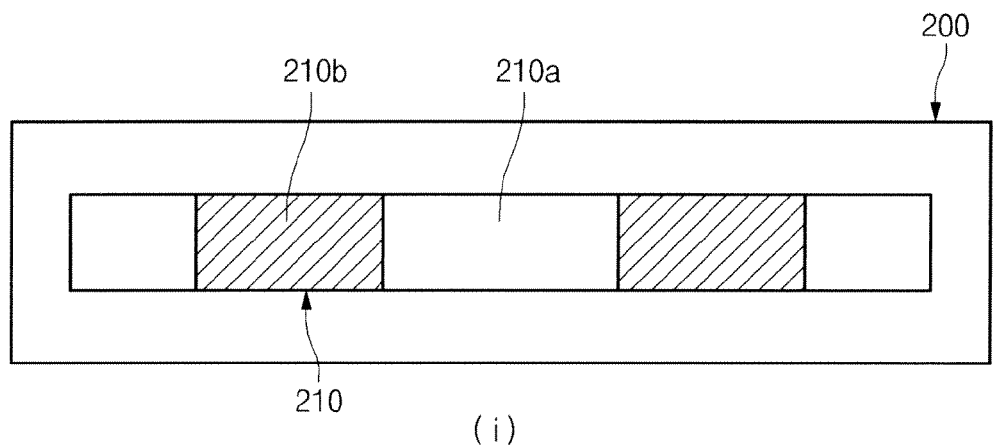
Figure 2C:
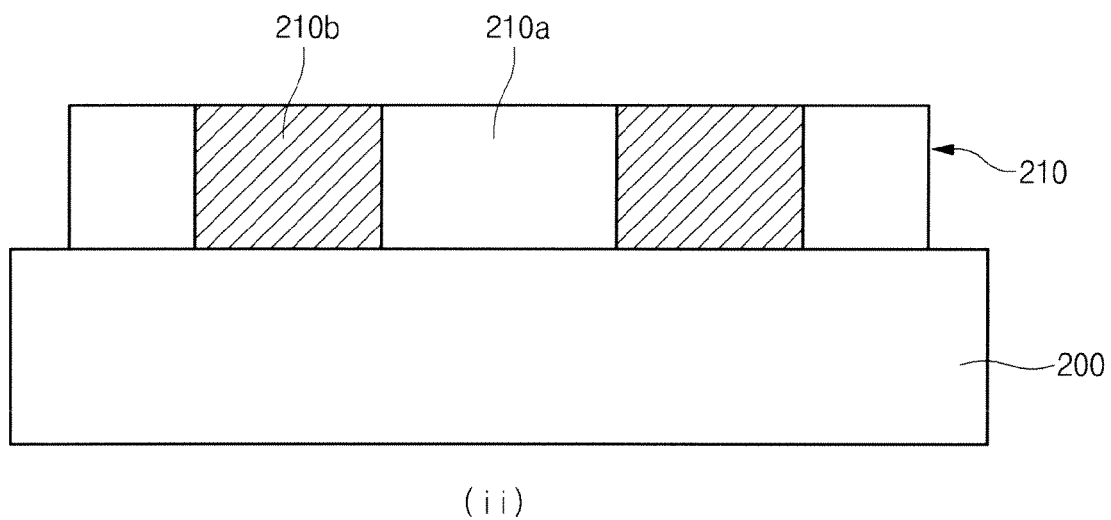

FIGS. 2a to 2c are diagrams illustrating a fuse of a semiconductor device and a method for forming the same according to an embodiment of the present invention. View (i) is a plane diagram illustrating a metal fuse, and view (ii) is a cross-sectional diagram taken along line X-X' of (i).

Referring to FIG. 2a, a first interlayer insulating film 200 is formed over a semiconductor substrate (not shown) having a lower structure, and a metal layer (not shown) is formed over the first interlayer insulating film 200. The metal layer (not shown) is patterned to form a plurality of metal fuses 210. The metal fuse 210 is formed to have a line type.

A laser blowing process is performed on one fuse selected from the metal fuses 210 in a subsequent process. A region cut by the laser blowing process is defined as a fuse blowing region 210a.

Referring to FIGS. 2b and 2c, a mask pattern 215 is formed over the metal fuse 210. The mask pattern 215 is formed so that both sides of the fuse blowing region 210a are open with respect to the fuse blowing region 210a. That is, the mask pattern 215 is formed between the fuse blowing region 210a and the edge of the metal fuse 210.

An impurity ion-implanting process is performed with the mask pattern 215 as a barrier, thereby obtaining an impurity ion-implanting region 210b at both sides of the fuse blowing region 210a of the metal fuse 210. The ion-implanting region 210b is formed in the metal fuse 210 between the fuse blowing region 210a and the edge of the metal fuse 210.

The impurity ion-implanting process is performed with one or more ions selected from the group consisting of oxygen, nitrogen and boron ions. The impurity ion-implanting process is performed with an energy ranging from about 200 KeV to about 400 KeV. The ion-implanting process of boron ions is performed with an energy ranging from about 250 KeV to about 350 KeV. The dose of the oxygen or nitrogen ions ranges from about $1.4 \times 10E13$ ions/cm$^2$ to about $1.4 \times 10E18$ ions/cm$^2$. The ion-implanting process of the oxygen ions is performed by a separation by implanted oxygen (SIMOX) method. The dose of the boron ions ranges from about $1.0 \times 10E10$ ions/cm$^2$ to about $2.0 \times 10E13$ ions/cm$^2$.

The mask pattern 215 is then removed. After the mask pattern 215 is removed, a second interlayer insulating film (not shown) is formed over the metal fuse 210 and the first interlayer insulating film 200, and etched by a repair etching process to open the metal fuse 210. However, the second interlayer insulating film (not shown) having a given thickness remains over the metal fuse 210.

A laser is irradiated into the fuse blowing region 210a of the metal fuse 210 by a laser blowing process, thereby cutting the corresponding metal fuse 210.

The impurity ion concentration is increased in the metal fuse positioned at both sides of the fuse blowing region, so that the resistance of the impurity ion-implanted region is increased. The electric and thermal conductivity of the metal fuse is thereby reduced. As a result, the energy of the laser irradiated into the fuse blowing region in the laser blowing process is prevented from being conducted into metal lines, thereby increasing thermal condensation efficiency of the fuse blowing region.

Figure 3:
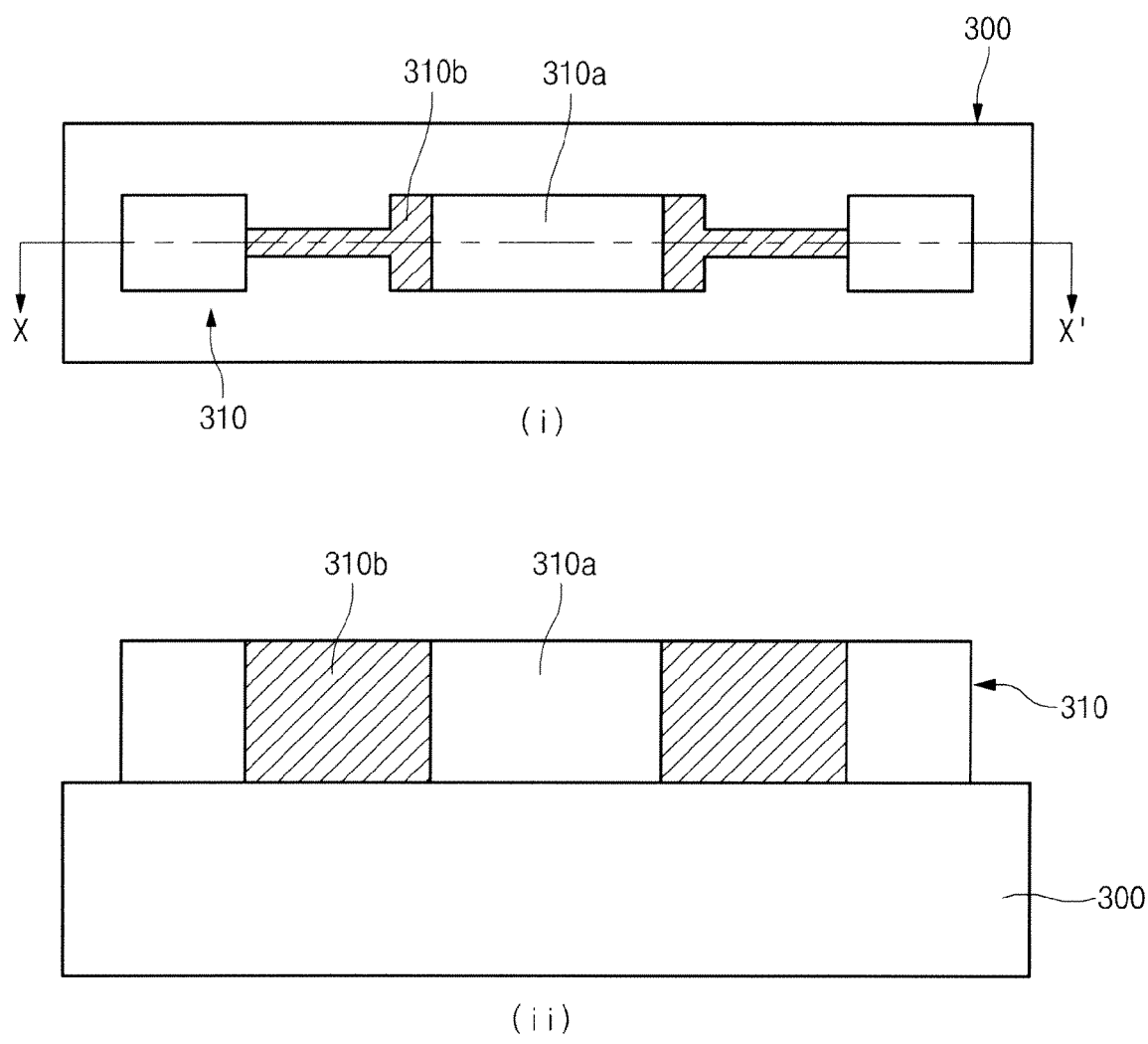
FIG. 3 is a diagram illustrating a fuse of a semiconductor device and a method for forming the same according to another embodiment of the present invention.

FIG. 3 is a diagram illustrating a fuse of a semiconductor device and a method for forming the same according to anther embodiment of the present invention. (i) is a plane diagram illustrating a metal fuse, and (ii) is a cross-sectional diagram taken along X-X' of (i).

Referring to FIG. 3, an interlayer insulating film 300 is formed over a semiconductor substrate (not shown) having a lower structure, and a plurality of metal fuses 310 are formed over the interlayer insulating film 300. A fuse blowing region 310a irradiated with a laser in a subsequent repair blowing process is defined in the center of the metal fuse 310.

The metal fuse 310 positioned at both sides of the fuse blowing region 310a is formed to have a smaller critical dimension (CD) than that of the fuse blowing region 310a. That is, the metal fuse 310 is formed to have a cross type. A CD of the edge of the metal fuse 310 is the same as that of the fuse blowing region 310a.

The metal fuse 310 positioned at both sides of the fuse blowing region 310a, which is a path for transmitting heat generated from energy in the laser blowing process, is formed to have a smaller CD, thereby inhibiting thermal transmission. As a result, the energy is sufficiently condensed in the fuse blowing region 310a so that the metal fuse 310 may be completely cut.

The same procedure shown in FIG. 2b is repeated to form a mask pattern (not shown) over the cross-type metal fuse 310. That is, the mask pattern (not shown) is formed to open a space between the fuse blowing region 310a and the edge of the metal fuse 310.

An impurity ion-implanting process is performed with the mask pattern (not shown) as a barrier to form an impurity ion-implanting region 310b at both sides of the fuse blowing region 310a.

The impurity ion-implanting process is performed with one or more ions selected from the group consisting of oxygen, nitrogen and boron ions. The impurity ion-implanting process is performed with an energy ranging from about 200 KeV to about 400 KeV. The ion-implanting process of boron ions is performed with an energy ranging from about 250 KeV to about 350 KeV.

The dose of the oxygen or nitrogen ions ranges from about $1.4 \times 10E13$ ions/cm$^2$ to about $1.4 \times 10E18$ ions/cm$^2$. The ion-implanting process of the oxygen ions is performed by a separation by implanted oxygen (SIMOX) method.

The dose of the boron ions ranges from about $1.0 \times 10E10$ ions/cm$^2$ to about $2.0 \times 10E13$ ions/cm$^2$.

The mask pattern (not shown) is removed.

The metal fuse positioned at both sides of the fuse blowing region is formed to have a smaller CD, thereby reducing a thermal transmission path of both sides of the fuse blowing region irradiated with a laser in a subsequent laser blowing process to inhibit thermal transmission into the metal lines. Impurity ions are implanted into both sides of the fuse blowing region, thereby reducing the electric and thermal conductivity to increase the thermal condensation efficiency of the fuse blowing region. As a result, the efficiency of the laser repair process can be improved.

Referring to FIGS. 2c and 3, the fuse of the semiconductor device formed by the above-described method may includes the metal fuse 210, 310 including the fuse blowing region 210a, 310a over the first interlayer insulating film 200, 300 formed over the semiconductor substrate (not shown). The impurity ion-implanting region 210b, 310b is formed between the fuse blowing region 210a, 310a and the edge of the metal fuse 210, 310.

The metal fuse 210, 310 may be formed to have a line type as shown in FIG. 2b or a cross type as shown in FIG. 3.

The ion-implanting region 210b, 310b is formed with one or more ions selected from the group consisting of oxygen, nitrogen and boron ions.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for forming a fuse of a semiconductor device, the method comprising:
    forming an interlayer insulating film over a semiconductor substrate;
    forming a metal fuse including a fuse blowing region over the interlayer insulating film;
    forming a mask pattern over the metal fuse to expose both sides of the fuse blowing region;
    ion-implanting with the mask pattern as a barrier to form an ion-implanting region in the metal fuse between the fuse blowing region and the edge of the metal fuse; and
    removing the mask pattern.

2. The method according to claim 1, wherein the metal fuse is formed to have a line type or a cross type.

3. The method according to claim 2, wherein the cross type metal fuse has a smaller critical dimension (CD) of both sides of the fuse blowing region than that of the fuse blowing region.

4. The method according to claim 1, wherein the mask pattern is formed over the fuse blowing region and an edge of the metal fuse.

5. The method according to claim 1, wherein the ion-implanting process is performed with one or more ions selected from the group consisting of oxygen, nitrogen and boron ions.

6. The method according to claim 5, wherein the dose of the oxygen ions ranges from about $1.4 \times 10E13$ ions/cm$^2$ to about $1.4 \times 10E18$ ions/cm$^2$.

7. The method according to claim 5, wherein the dose of the nitrogen ions ranges from about $1.4 \times 10E13$ ions/cm$^2$ to about $1.4 \times 10E18$ ions/cm$^2$.

8. The method according to claim 5, wherein the dose of the boron ions ranges from about $1.0 \times 10E10$ ions/cm$^2$ to about $2.0 \times 10E13$ ions/cm$^2$.

9. The method according to claim 1, wherein the ion-implanting process is performed with an energy ranging from about 200 KeV to about 400 KeV.

10. The method according to claim 1, after removing the mask pattern, further comprising:
    forming an insulating film over the metal fuse and the interlayer insulating film;
    etching the insulating film to form a fuse open region; and
    irradiating a laser into the fuse blowing region to cut the metal fuse.

* * * * *